United States Patent [19]
Takahashi et al.

[11] 3,955,100
[45] May 4, 1976

[54] SIGNAL TRANSFER SYSTEM OF CHARGE TRANSFER DEVICE WITH CHARGE RETAINING CLOCKING PROVIDING FIXED TRANSFER TIME WITHIN VARIABLE TRIGGER PULSE TIME PERIOD

[75] Inventors: Kenji Takahashi, Ebina; Shusaku Nagahara, Kokubunji, both of Japan

[73] Assignee: Hitachi, Ltd., Japan

[22] Filed: Sept. 17, 1974

[21] Appl. No.: 506,835

[30] Foreign Application Priority Data
Sept. 17, 1973 Japan.............................. 48-103833
July 5, 1974 Japan................................49-76378

[52] U.S. Cl............................ 307/221 D; 307/208; 307/269; 307/228; 307/268
[51] Int. Cl.²..................... H03K 4/94; G11C 19/28
[58] Field of Search......................... 328/61, 62, 63; 307/221 C, 221 D, 228, 208, 268, 269

[56] References Cited
UNITED STATES PATENTS

| | | | |
|---|---|---|---|
| 3,596,188 | 7/1971 | Hasse.................... | 328/62 |
| 3,603,808 | 9/1971 | Sangster.................. | 307/221 D |
| 3,651,349 | 3/1972 | Kahng.................... | 307/221 C |
| 3,660,697 | 5/1972 | Berglund................. | 307/221 C |
| 3,700,932 | 10/1972 | Kahng.................... | 307/221 C |
| 3,737,683 | 6/1973 | Sangster.................. | 307/221 D |
| B309,755 | 1/1975 | Weimer.................... | 307/221 D |

OTHER PUBLICATIONS
Boyle et al., The Bell System Technical Journal, "Charge Coupled Semiconductor Devices," 4/1970, pp. 587–600.

*Primary Examiner*—John S. Heyman
*Attorney, Agent, or Firm*—Craig & Antonelli

[57] ABSTRACT

A charge transfer device is made up of a plurality of charge transfer stages, each stage being composed of a plurality of capacitors and corresponding transfer electrodes. Signal charges are transferred from one stage to another by impressing clock pulses from a pulse supplying circuit to respective transfer electrodes. The pulse supplying circuit sequentially applies clock pulses which are adapted to transfer a signal charge to the initial capacitor of a respective stage during a fixed transfer time period, for a predetermined period of time within a variable time period corresponding to a delay period of time, to the respective transfer electrodes. The pulse supplying circuit also applies a clock pulse which is adapted to cause charges which are transferred to the initial capacitor to be retained therein, for the remaining period of time of said variable time period, this clock pulse being applied to a corresponding electrode of the initial capacitor.

14 Claims, 26 Drawing Figures

FIG. 1
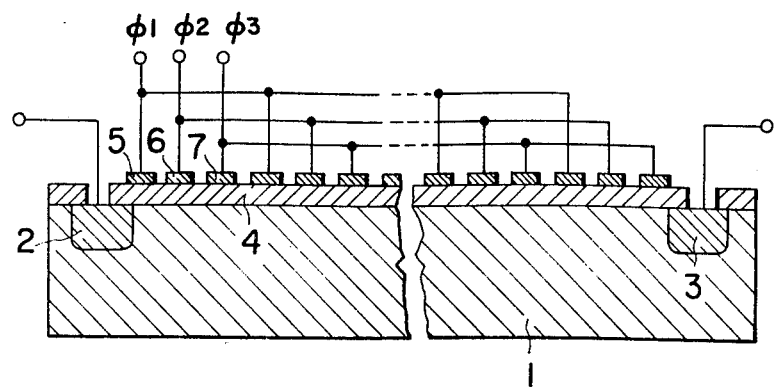
FIG. 2
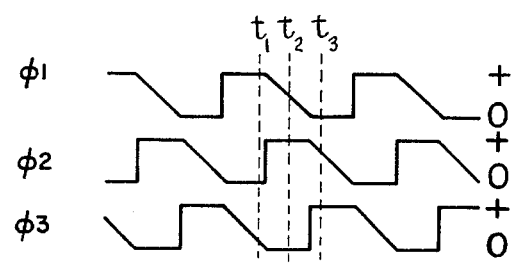
FIG. 3a   FIG. 3b   FIG. 3c
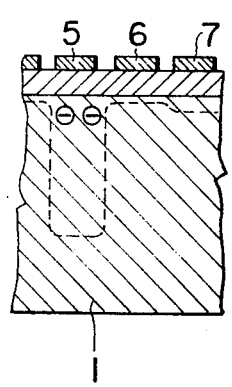 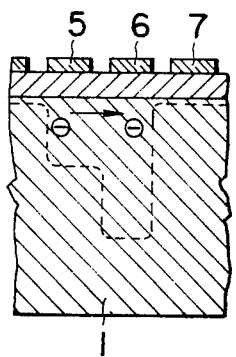 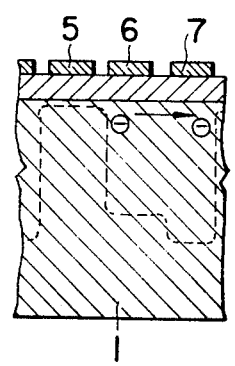

SIGNAL TRANSFER SYSTEM OF CHARGE TRANSFER DEVICE WITH CHARGE RETAINING CLOCKING PROVIDING FIXED TRANSFER TIME WITHIN VARIABLE TRIGGER PULSE TIME PERIOD

BACKGROUND OF THE INVENTION

This invention relates to a signal transfer system for a charge transfer device (hereinafter abbreviated CTD).

As an example of such a CTD, a charge coupled device (hereinbelow abbreviated CCD) employing three-phase or four-phase drive is known.

The CCD is constructed such that an input source electrode and an output drain electrode are provided in a substrate, a large number of transfer electrodes are arranged on the substrate between the source and drain electrodes through an insulating film, and three or four of the transfer electrodes constitute one stage. By successively applying three-phase or four-phase clock pulses to the transfer electrodes, charges in capacitors formed under the respective transfer electrodes are successively shifted and are fed to subsequent stages.

Such a CTD becomes a variable delay line by varying the clock frequency. The variable delay line can be used for compensating the time axis fluctuations of a recording appliance or equipment having a mechanical rotation system, such as video tape recorder and magnetic disc. When the CTD is operated by making the clock frequency during writing different than during reading, it can subject a signal to time compression or time expansion. Various applications of the CTD are considered in this manner, and for the time axis transforming operation as stated above, the clock must be frequency-modulated. When the clock frequency changes in this way, the transfer time of charges similarly changes. A change of the transfer time leads, in itself, to a change of the transfer efficiency. During the time axis transforming operation, the frequency characteristic changes with time. The operation has thus become inconvenient in the prior art.

The prior art has also had the disadvantage that a circuit for generating clock pulses corresponding to the respective clock frequencies becomes very complicated.

SUMMARY OF THE INVENTION

The principal object of this invention is to provide a signal transfer system for a charge transfer device which always maintains the transfer efficiency constant and makes a stable operation possible.

Another object of this invention is to provide a signal transfer system which is constructed of simple means.

In addition to the foregoing feature of transferring a signal, the CTD has the capability of storing the signal. That is, when a state, in which, among the plurality of transfer electrodes constituting one stage, a certain electrode has a predetermined high potential applied thereto and the other electrodes have a different low potential applied thereto, is maintained for a fixed time, charges remain beneath the electrode with the predetermined potential applied and the signal is accumulated for the fixed time.

Upon taking note of such an accumulative function, this invention is characterized in that clock pulses for transferring charges at a fixed transfer time are sequentially applied to respective transfer electrodes for a fixed period within a variable period of time corresponding to a delay time. A clock pulse for retaining transferred charges beneath a predetermined transfer electrode is applied to the transfer electrode for the remaining period within said variable period of time.

BRIEF DESCRIPTION OF THE DRAWINGS

FIG. 1 is a diagram showing the structure of a CCD having a three-phase drive.

FIG. 2 is a waveform diagram for explaining the operation of the device in FIG. 1.

FIGS. 3a, 3b and 3c are diagrams for explaining the states of signal transfer of the device in FIG. 1.

DETAILED DESCRIPTION OF THE INVENTION

Figure 4:
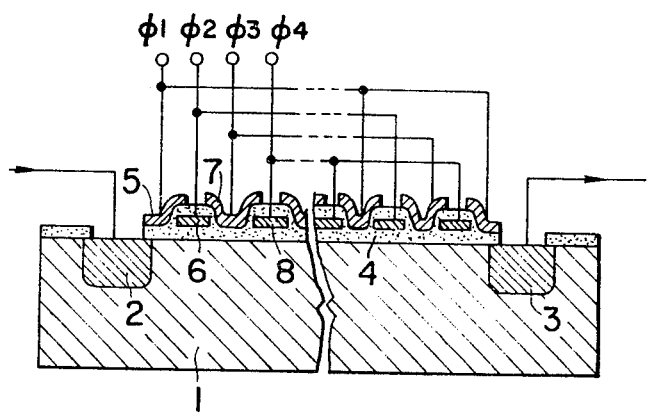
FIG. 4 is a diagam showing the structure of a CCD having four-phase drive.

FIG. 1 shows the structure of a CCD of the three-phase drive. A P-type semiconductor substrate 1 is provided with a source electrode for input semiconductor region 2 and a drain electrode for output semiconductor region 3, while the first-, second- and third-phase transfer electrodes 5, 6 and 7 are arranged on the P-type substrate 1 through an insulating film 4. One stage is constructed of the three transfer electrodes 5, 6 and 7, and a large number of such stages are connected in cascade. Regions 2 and 3 are of N-type conductivity.

In FIG. 2, symbols $\phi_1$, $\phi_2$ and $\phi_3$ indicate the waveforms of clock pulses which are respectively applied to the first-, second- and third- phase transfer electrodes 5, 6 and 7 in FIG. 1.

By sequentially impressing such clock pulses $\phi_1$, $\phi_2$ and $\phi_3$ on the transfer electrodes 5, 6 and 7 in FIG. 1, input charges supplied to the source electrode 2 are sequentially transferred to capacitors under the respective transfer electrodes, and they are delivered as an output from the drain electrode 3.

FIGS. 3a, 3b and 3c illustrate the states of signal transfer of the device in FIG. 1, which states correspond to potential wells at times $t_1$, $t_2$ and $t_3$ in FIG. 2, respectively.

More specifically, at the time $t_1$, the potential of the transfer electrode 5 is the highest and charges are accumulated in the capacitor beneath it as illustrated in FIG. 3a. At time $t_2$, the potential of the transfer electrode 6 becomes the highest and the charges under the transfer electrode 5 are shifted to the capacitor beneath the transfer electrode 6, as illustrated in FIG. 3b. At time $t_3$, the potential of the transfer electrode 7 becomes the highest and the charges are shifted beneath the electrode as illustrated in FIG. 3c. Consequently, after the time of one period of the clock pulses, the charges are transferred in the direction of arrows in FIG. 3 to the amount of three electrodes or one stage. In this way, the charges injected into the source electrode 2 are transferred by the electric fields along the interface between the insulating film 4 and the P-type substrate 1, and they are sequentially extracted as an output signal from the drain electrode 3.

FIG. 4 shows the structure of a CCD having four-phase drive. A P-type substrate 1 is provided with an input source electrode 2 being an N-type diffused layer and an output drain electrode 3 being an N-type diffused layer. On the P-type substrate, a second-phase transfer electrode 6 and a fourth-phase transfer electrode 8 are formed through a thin insulating film 4. Further, in the insulating film 4, a first-phase transfer electrode 5 and a third-phase transfer electrode 7 are formed in a manner to correspond to the interspaces between second- and fourth-phase transfer electrodes 6 and 8.

Figure 5:
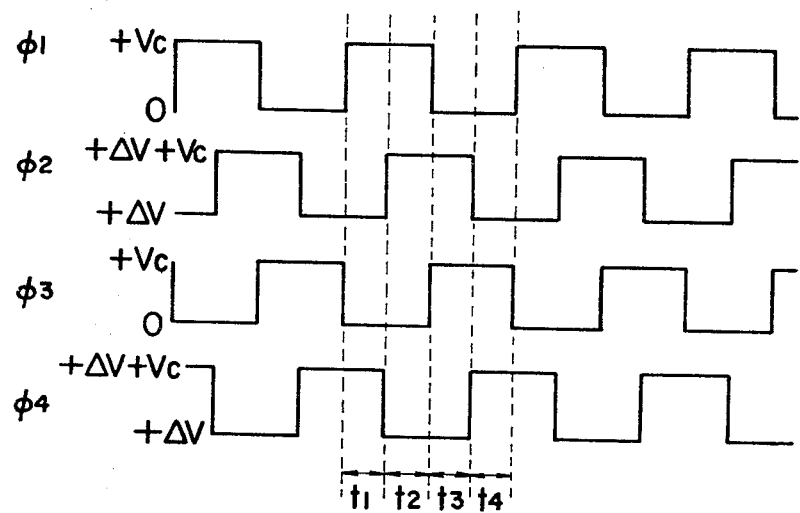
FIG. 5 is a waveform diagram for explaining the states of the operation of the device in FIG. 4.

$\phi_1$, $\phi_2$, $\phi_3$ and $\phi_4$ in FIG. 5 denote the waveforms of the first-, second-, third- and fourth-phase clock pulses which are respectively impressed on the electrodes 5, 6, 7 and 8 in FIG. 4. The clock pulses are rectangular waves and, letting the phase of the first-phase clock pulse be 0 radians, the second phase is shifted by $\pi/2$ radians, the third phase by $\pi$ radians and the fourth phase by $3/2\ \pi$ radians. In addition, the first-phase clock pulse and the third-phase clock pulse change from O to $+V_c$, while the second-phase clock pulse and the fourth- phase clock pulse change from $+\Delta$ V to $+\Delta V + V_c$. In other words, the second-phase clock pulse and the fourth-phase clock pulse undergo a D.C. level shift by $\Delta$ V as compared with the first-phase clock pulse and the third-phase clock pulse. The quantity of the D.C. shift ($\Delta V$) can be arbitrarily selected in the range $O \leq \Delta V < +V_c$. The amplitudes of the clock pulses of the respective phases may differ to some extent, and need not coincide for all phases.

Figure 6A:
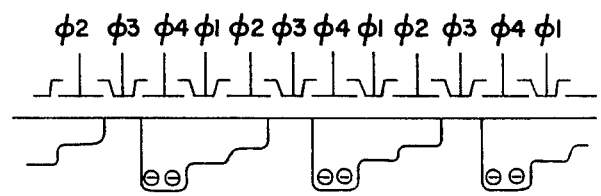
FIGS. 6a, 6b, 6c and 6d are diagrams for explaining the states of signal transfer of the device in FIG. 4.
Figure 6B:
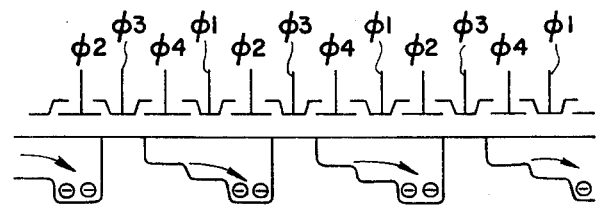
Figure 6C:
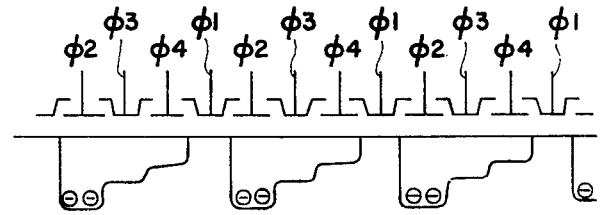
Figure 6D:
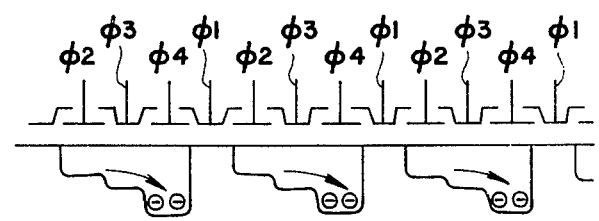

The transfer operation of the four-phase drive CCD in FIG. 4 will now be explained in detail with reference to FIGS. 6a to 6d. Consider the state of a period $t_1$ in FIG. 5. Then, as illustrated in FIG. 6a, the potential wells are created in correspondence with the applied potentials, and electrons (signal charges) exist beneath the fourth-phase electrodes 8 to which the clock pulse $\phi_4$ of the highest potential is impressed. In the subsequent period $t_2$, the potential of the second-phase electrodes 6 with the clock pulse $\phi_2$ impressed thereon and that of the fourth-phase electrodes 8 with the clock pulse $\phi_4$ impressed thereon are reversed (FIG. 6b), so that the signal charges pass through the first-phase electrodes 5 with the clock pulse $\phi_1$ impressed thereon and they are transferred beneath the second-phase electrodes with the clock pulse $\phi_2$ impressed thereon. During period $t_3$, the potential of the first-phase electrodes 5 with the clock pulse $\phi_1$ impressed thereon and that of the third-phase electrodes 7 with the clock pulse $\phi_3$ impressed thereon are reversed, and the position at which each channel is cut off moves from beneath the third-phase electrode 7 with the clock pulse $\phi_2$ impressed thereon to beneath the first-phase electrode 5 with the clock pulse $\phi_1$ impressed thereon. The signal charges, however, remain beneath the second-phase electrodes 6 to which the clock pulse $\phi_2$ of the deepest potential well is impressed, and are not transferred (FIG. 6c). During period $t_4$, as illustrated in FIG. 6d, the potential of the second-phase electrodes 6 with the clock pulse $\phi_2$ impressed thereon and that of the fourth-phase electrodes 8 with the clock pulse $\phi_4$ impressed thereon are reversed again, and the signal charges are transferred beneath the fourth-phase electrodes 8 with the clock pulse $\phi_4$ impressed thereon. The same operation is thereafter repeated, and the signal charges are successively transferred from the source electrode 2 to the drain electrode 3.

As is apparent from FIGS. 5 and 6, the signal charges are transferred only during the period $t_2$ and the period $t_4$, that is, only when the potentials of the second-phase electrodes 6 and the fourth-phase electrodes 8 are reversed. For period $t_1$ or period $t_3$, the charges are accumulated and retained beneath either the second-phase electrodes 6 or the fourth-phase electrodes 8 and are not transferred. The signal charges are never accumulated and retained beneath the first-phase electrodes 5 or the third-phase electrodes 7, and both electrodes 5 and 7 merely effect a switching operation.

In the waveforms in FIG. 5, the transfer time of charges is the period $t_2$ or $t_4$. The charge transfer time $t_s$ is represented by:

$$t_s = \frac{1}{4f_c} (\text{sec}) \qquad (1)$$

where $f_c$ denotes the clock frequency.

A rotary recording appliance or equipment such as video tape recorder and magnetic disc has a mechanical rotation system, and therefore gives rise to a time axis fluctuation (jitter). In order to compensate for this, the time axis transformation can be made by the use of the CTD.

When the CTD is operated in such a manner that the clock frequency during writing and the clock frequency during reading are caused to differ, it can subject a signal to time compression or time expansion.

Figure 7:
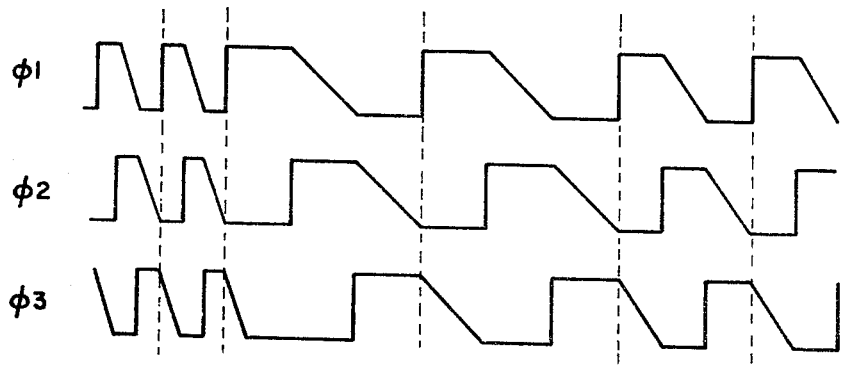
FIGS. 7 and 8 are waveform diagrams of clock pulses in the prior art as applied to the devices in FIGS. 1 and 4, respectively.
Figure 8:
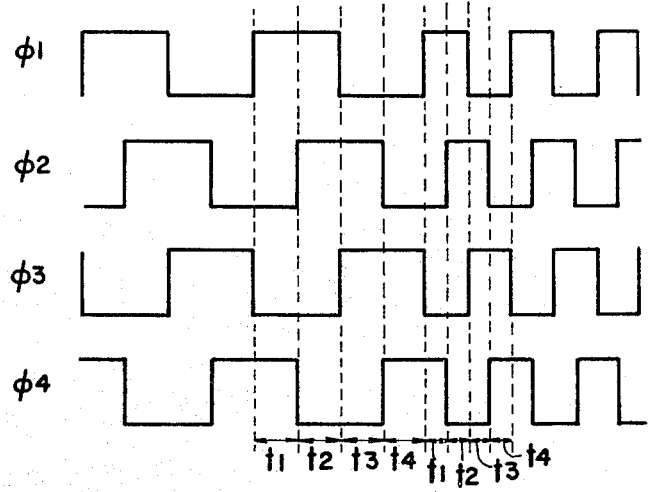

In order to perform such a time axis transforming operation, it has hitherto been contrived that, as illustrated in FIGS. 7 and 8, the frequencies of the clock pulses are varied in correspondence with delay states.

However, when the clock frequency is thus varied to change the charge transfer time, there are drawbacks in that the transmitting efficiency changes and that the frequency characteristic changes. A further disadvantage is that circuits for generating the clock pulses corresponding to the respective trigger pulse periods become complicated.

Figure 9:
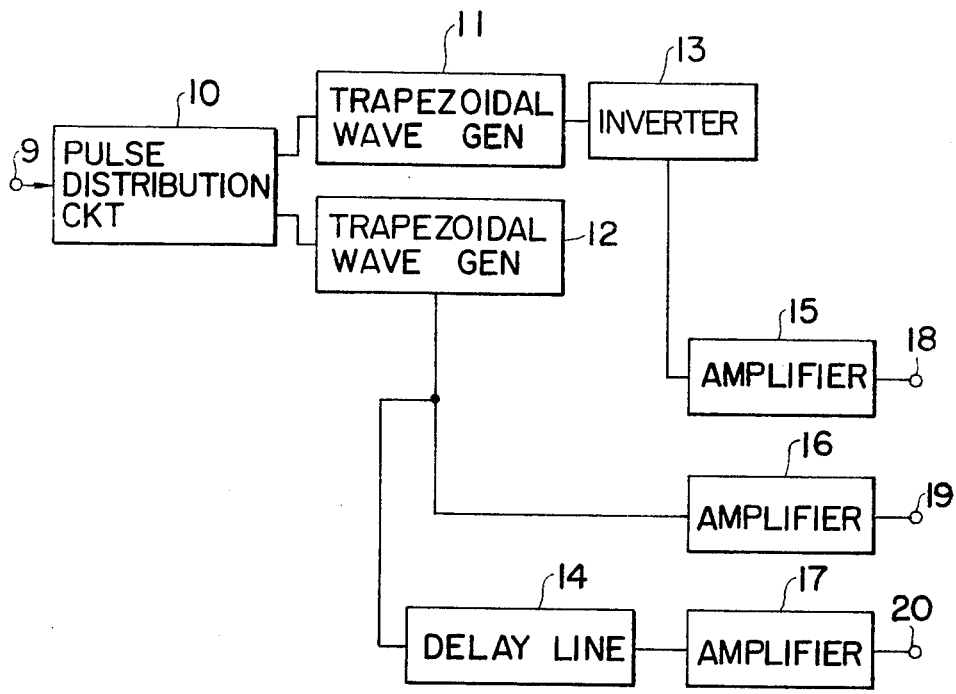
FIG. 9 is a block diagram of an embodiment of a circuit which generates clock pulses for use in the signal transfer system of this invention.

FIG. 9 shows an embodiment of a circuit for generating the clock pulses for use in the present invention. Numeral 9 designates an input terminal for trigger pulses which have pulse intervals corresponding to delay states and which pulse intervals change continuously. Numeral 10 indicates a pulse distribution circuit which distributes each of the trigger pulses into two parts. Shown at 11 and 12 are trapezoidal wave generators. Numeral 13 represents an inverter, while numeral 14 is a delay line. Numerals 15–17 denote D.C. amplifiers, and 18–20 output terminals.

Figure 10A:
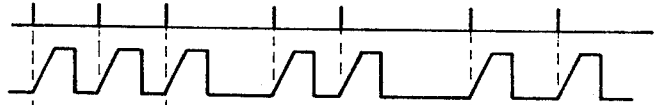
FIGS. 10a–10e are diagrams of waveforms at various parts in FIG. 9.
Figure 10B:
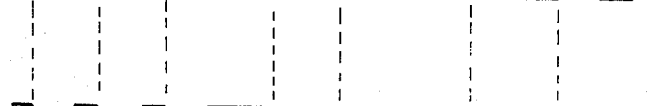

In FIG. 9, the trigger pulses which, as illustrated in FIG. 10a, vary continuously in correspondence with delay states are delivered from the input terminal 9 to the pulse distribution circuit 10. The trigger pulse is distributed by the pulse distribution circuit 10 into two parts, one of which is supplied to one trapezoidal wave generator 11 and the other of which is supplied to the other trapezoidal wave generator 12. An output waveform as shown in FIG. 10b is generated from the trapezoidal wave generator 11, while an output waveform as shown in FIG. 10d is generated from the trapezoidal wave generator 12.

In these waveforms, the time width of a flat portion, a rise portion or a fall portion is so set as to become one-third of a clock period at the maximum set frequency of the clock pulses.

Figure 10C:
Figure 10D:
Figure 10E:
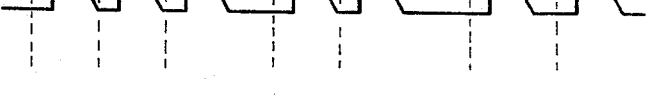

The output of the trapezoidal wave generator 11 is inverted by the inverter 13 and is thereafter amplified by the D.C. amplifier 15, so that the first-phase clock pulses as shown in FIG. 10c are provided from the output terminal 18. The output of the trapezoidal wave generator 12 is directly amplified by the D.C. amplifier 16, and is delivered to the output terminal 19 as the second-phase clock pulses which, as illustrated in FIG. 10d, are delayed in phase by one-third of the clock period at the maximum set frequency of the clock pulses. Simultaneously therewith, the output of the trapezoidal wave generator 12 has its phase delayed by one-third of the clock period by means of the delay line 14, and is thereafter amplified by means of the D.C. amplifier 17, to be delivered to the output terminal 20 as the third-phase clock pulses as shown in FIG. 10e. The clock pulses in FIGS. 10c, 10d and 10e as thus obtained are impressed on the transfer electrodes 5, 6 and 7 in FIG. 1.

In this manner, the clock pulses of the respective phases are impressed on the transfer electrodes once by the single trigger pulse, and the respective phases of the clock pulses are always constant without depending on the period of the trigger pulses. When the period of the trigger pulse becomes long, the driving pulse of the first phase is maintained at a positive potential and the driving pulses of the second and third phases are fixed at 0 or a negative potential, so that charges are retained in the capacitor under the transfer electrode with the first-phase drive pulse impressed thereon.

That is, each time the trigger pulse arrives, the input signal is transferred to the next stage at a fixed time being determined by the maximum set frequency of the clock pulses. It is accumulated and retained until the next trigger pulse arrives.

In this way, a variable delay operation or a time axis transforming operation can be conducted. Since the charge transfer time is constant in this case, the transmitting efficiency is invariable. A further feature is that the circuit arrangement becomes very simple.

Figure 11:
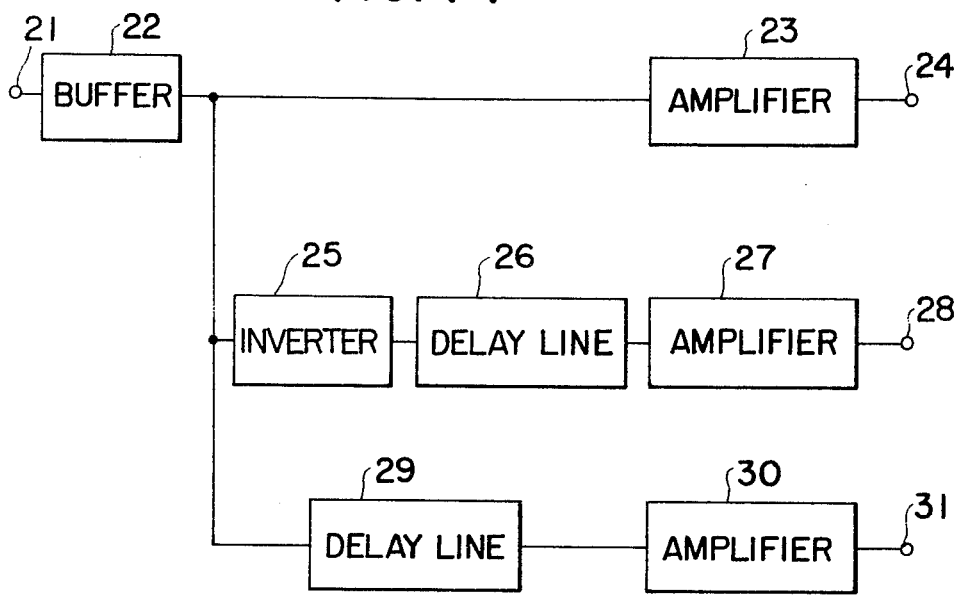
FIG. 11 is a block diagram of another embodiment of the circuit which generates clock pulses for use in the signal transfer system of this invention.

FIG. 11 shows another embodiment of the circuit which generates the clock pulses for use in the system of the present invention. In the embodiment, rectangular waves are employed for the clock pulses instead of the foregoing trapezoidal waves.

In the figure, number 21 designates an input terminal of trigger pulses; 22 a buffer; 23, 27, and 30 output amplifiers; 24, 28 and 31 output terminals; 25 an inverter, and 26 and 29 delay lines.

Figure 12A:
FIGS. 12a–12d are diagrams of waveforms at various parts in FIG. 11.
Figure 12B:
Figure 12C:

When trigger pulses shown in FIG. 12a are delivered from the input terminal 21 to the buffer 22, each is distributed into three parts on the output side of the buffer. One of the three outputs is directly applied to the outpt amplifier 23, so that the second-phase clock pulses shown in FIG. 12c are supplied from the output terminal 24.

Figure 12D:

Another output is inverted by the inverter 25, and is thereafter delayed by one-sixth of a clock period at the maximum set frequency of the clock pulses by means of the delay line 26. Thus, through the output amplifier 27, the first-phase clock pulses shown in FIG. 12b are delivered from the output terminal 28. The remaining output is delayed by a time of one-third of the above clock period by means of the delay line 29, and is thereafter passed through the output amplifier 30. Thus, the third-pulse clock pulses shown in FIG. 12d are delivered from the output terminal 31.

By impressing the clock pulses of the respective phases thus obtained on the transfer electrodes in FIG. 1, signal transfer is carried out.

Figure 13:
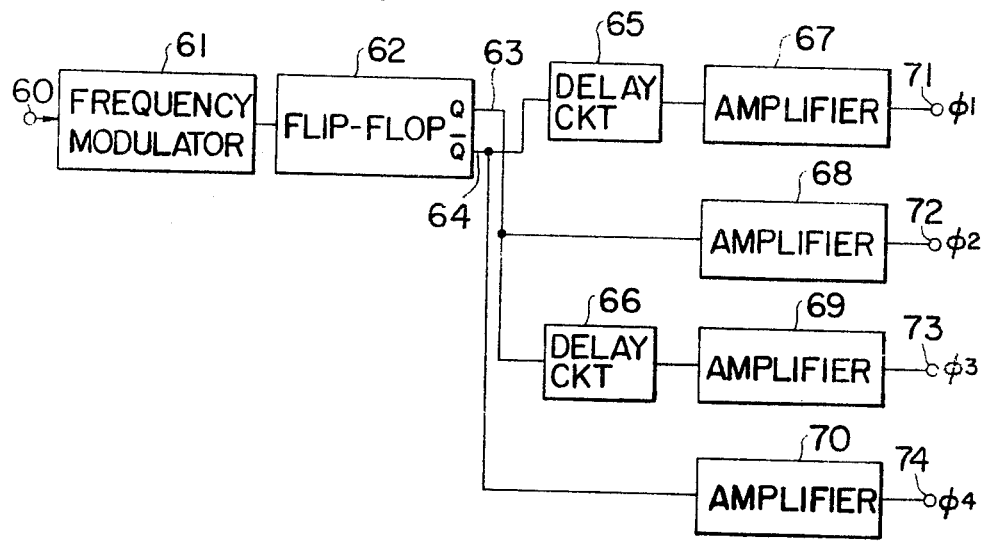
FIG. 13 is a block diagram of still another embodiment of the circuit which generates clock pulses for use in the signal transfer system of this invention.

FIG. 13 shows still another embodiment of the circuit which generates clock pulses for use in the signal transfer system of the present invention. The embodiment is employed for four-phase drive.

In the figure, numeral 60 indicates an input terminal to which is supplied a modulating signal whose level varies continuously in correspondence with delay states. Shown at 61 is a frequency modulator which effects frequency modulation with the modulating signal from the input termnal 60. Element 62 is a flip-flop, and numerals 63 and 64 represent the affirmation output and negation output of the flip-flop 62. Numerals 65 and 66 denote delay circuits, 67–70 pulse amplifier circuits, and 71–74 output terminals.

Figure 14:
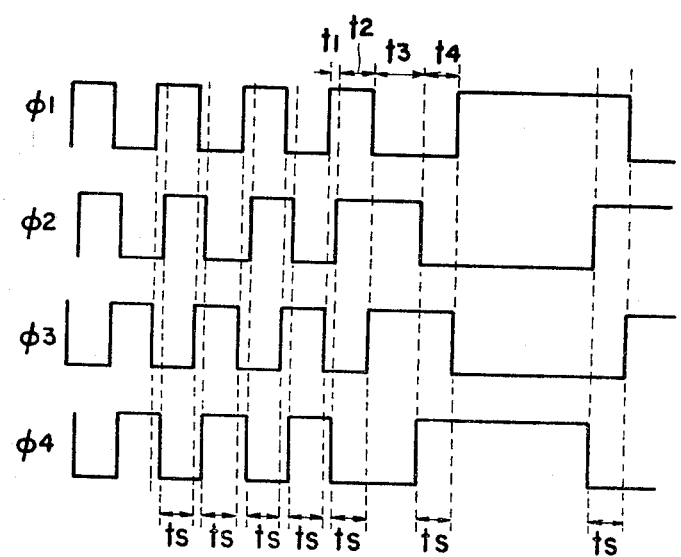
FIG. 14 is a diagram of waveforms at various parts in FIG. 13.

First of all, the frequency modulator 61 generates pulses at a frequency which is twice as high as the clock frequency as frequency-modulated by the modulating signal from the input terminal 60. The output pulses of the frequency modulator 61 have the frequency divided by 2 by means of the flip-flop circuit 62. Each of the affirmation output 63 and the negation output 64 is brought into two branches. The branched affirmation and negation output constituting one set are respectively supplied to the pulse amplifier circuits 68 and 70. Thus, the second-phase clock pulse $\phi_2$ and the fourth-phase clock pulse $\phi_4$ as illustrated in FIG. 14 are respectively delivered from the output terminals 72 and 74. The negation and affirmation outputs constituting the other set are delayed by a time equivalent to the transfer time $t_s$ by means of the delay circuits 65 and 66, and are delivered to the pulse amplifier circuits 67 and 69, respectively. Thus, the first-phase clock pulse $\phi_1$ and the third-phase clock pulse $\phi_3$, as illustrated in FIG. 14, are delivered from the output terminals 71 and 73. These clock pulses are applied to the transfer electrodes 5, 6, 7 and 8 in FIG. 4.

Figure 15:
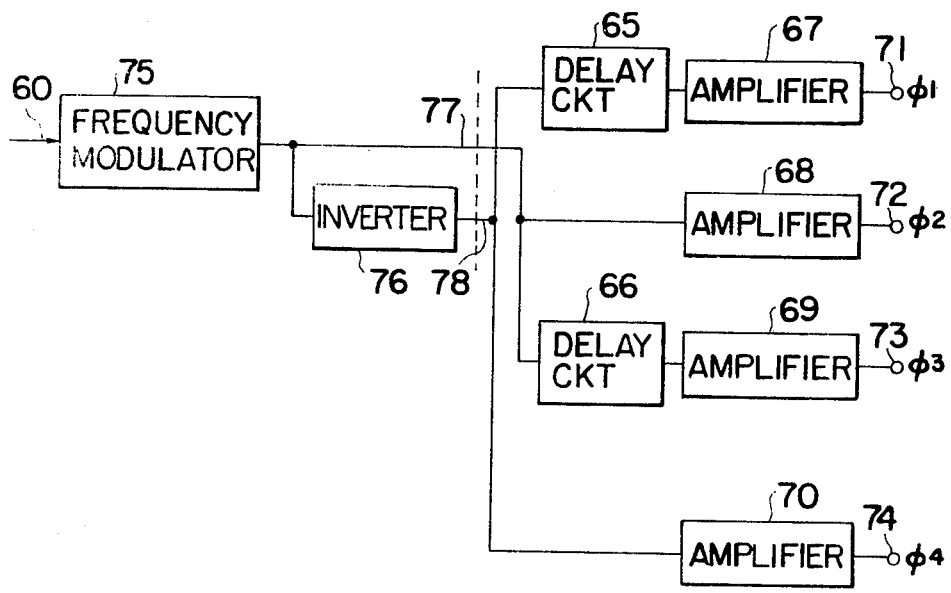
FIG. 15 is a block diagram of yet another embodiment of the circuit which generates clock pulses for use in the signal transfer system of this invention.

With a circuit arrangement in which a frequency modulator can directly generate rectangular waves, a circuit configuration shown in FIG. 15 can also generate similar waveforms. In this case, the rectangular wave output of the frequency modulator 75 need not have a 50 percent duty cycle. The rectangular wave pulse generated from the frequency modulator 75 is divided into two pulses, one of which is inverted by an inverter 76. The inverter output 78 and the direct output 77 of the frequency modulator correspond to the negation output 64 and affirmation output 63 of the flip-flop circuit 62 is FIG. 13. With the same succeeding stages as in FIG. 13, similar waveforms are obtained. In the case of FIG. 15, the frequency modulator 75 may generate the same frequency as the clock frequency.

Where the outputs of the circuit in FIG. 15 are used as clock pulses, the clock pulses $\phi_2$ and $\phi_4$ must be subjected to a D.C. shift as has been explained in connection with FIG. 5.

Figure 16:
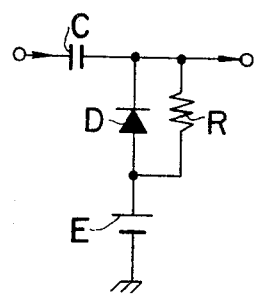
FIG. 16 is a connection diagram of an example of a D.C. shift circuit for use in the circuits in FIGS. 13 and 15.

FIG. 16 shows an example of a D.C. shift circuit therefor. It is a diode clamp circuit which is composed of a capacitor C, a diode D, a resistor R and a D.C. power source E. With this circuit, the shift can, of course, be any potential by changing the clamp potential of the power source E. Such D.C. shift circuits are provided as parts of the pulse amplifier circuits 68 and 70 in FIGS. 13 and 15 and in the interior or exterior of the circuits.

Needless to say, the waveforms of the clock pulses are not restricted to the foregoing examples, but various modifications are considered.

The time width and the interval of the clock pulses of the respective phases are not restricted to the foregoing examples, but they can take various values.

Further, not only the three-phase and four-phase clock pulses, but also clock pulses of more phases can be adopted.

What is claimed is:

1. A signal transfer system comprising:
    a charge transfer device including a plurality of charge trans er stages connected in cascade, each stage having a plurality of transfer electrodes and respective capacitances coupled therewith for effecting the transfer of charges, in response to transfer signals applied to said transfer electrodes;
    input means for introducing charges into the initial capacitance of the first stage among said plurality of charge transfer stages;
    output means for deriving an output from the last capacitance of the final stage among said plurality of charge transfer stages; and
    potential supplying means, coupled to said transfer electrodes, for sequentially applying to said transfer electrodes, during a fixed transfer period of time within a variable period of time corresponding to a delay period, a first clock signal for transferring charges to the capacitance associated with the initial transfer electrode of a respective transfer stage, and for applying to the initial transfer electrode of said respective transfer stage, during the remaining portion of said variable period of time, a second clock signal for retaining charges in the capacitance associated with said initial transfer electrode of said respective transfer stage.

2. A signal charge transfer system according to claim 1, wherein said charge transfer device comprises a semiconductor substrate, an insulating film disposed on one surface of said substrate, and a plurality of electrodes, corresponding to said transfer electrodes, disposed in contact with said insulating film so as to be disposed over the surface of said substrate and separated therefrom by said insulating film, and wherein said input and output means comprise respective source and drain electrodes coupled to said substrate and separated from each other by said transfer electrodes therebetween.

3. A signal charge transfer system according to claim 1, wherein each of said stages includes respective first, second, and third transfer electrodes to which first, second and third clock pulses shifted in phase with respect to one another are respectively applied by said potential supplying means.

4. A signal charge transfer system according to claim 3, wherein said potential supplying means comprises:
    first means, responsive to trigger pulses, having variable time intervals therebetween, applied thereto, for generating first and second pulses in accordance with the application of each respective trigger pulse,
    second means, responsive to each first pulse, for generating a first trapezoidal wave pulse of a fixed time width, said first trapezoidal wave pulse having a gradually sloping rise portion and an abrupt fall portion,
    an inverter connected to the output of said second means,
    third means, responsive to each second pulse, for generating a second trapezoidal wave pulse of a fixed time width, said second trapezoidal wave pulse having an abrupt rise portion and a gradually sloping fall portion,
    fourth means, coupled to said third means, for delaying said second trapezoidal wave pulse by a prescribed period of time, and
    first, second and third output means, respectively coupled to said inverter, said third means, and said fourth means, for providing said first, second and third clock pulses.

5. A signal charge transfer system according to claim 4, wherein said first, second and third output means comprise respective amplifiers connected to the respective outputs of said inverter, said third means, and said fourth means.

6. A signal charge transfer system according to claim 3, wherein said potential supplying means comprises:
    first means, responsive to trigger pulses, having variable time ntervals therebetween, applied thereto, for generating respective first, second, and third rectangular wave pulses.
    an inverter coupled to receive the second rectangular wave pulse from said first means,
    first delay means, connected to said inverter, to delay the inverted second rectangular wave pulse by a first fixed period of time,
    second delay means, coupled to receive said third rectangular wave pulse and to delay said third rectangular wave pulse by second fixed period of time longer than said first fixed period of time, and
    second means, coupled to said first means, said first delay means and said third delay means, respectively, for providing said first, second and third clock pulses.

7. A signal charge transfer system according to claim 6, wherein said second means comprises a respective amplifier connected to the respective outputs of said first means, said first delay means, and said second delay means.

8. A signal charge transfer system according to claim 1, wherein each of said stages includes respective first, second, third, and fourth transfer electrodes to which first, second, third and fourth clock pulses, shifted in phase with respect to one another are respectively applied by said potential supplying means.

9. A signal charge transfer system according to claim 8, wherein said potential supplying means comprises:

first means for frequency modulating an input signal, the level of which is continuously variable, a flip-flop coupled to the output of said first means and having first and second respectively inverted outputs, first delay means, coupled to the second output of said flip-flop, for delaying said second output by a fixed period of time, second delay means, coupled to the first output of said flip-flop, for delaying said first output by said fixed period of time, and second means, coupled to the first and second respectively inverted outputs of said flip-flop and to said first and second delay means, for providing said second, fourth, first and third clock pulses, respectively.

10. A signal charge transfer system according to claim 9, wherein said second means includes respective amplifiers coupled to amplify each of said clock pulses.

11. A signal charge transfer system according to claim 8, wherein said potential supplying means comprises:

first means for frequency modulating an input signal, the level of which is continuously variable, an inverter circuit coupled to the output of said first means, first and second delay means, respectively coupled to the outputs of said first means and said inverter circuit, for delaying the outputs thereof by predetermined periods of time, and second means coupled to said second delay means, said first means, and first delay means, and said inverter, respectively, for providing said first, second, third and fourth clock pulses.

12. A signal charge transfer system according to claim 11, wherein said first means includes a respective amplifier connected to each of said first and second delay means, said inverter and said first means.

13. A signal charge transfer system according to claim 12, wherein each amplifier connected to said first means and said inverter, respectively includes means for shifting the D.C. level of the input thereto.

14. A signal charge transfer system according to claim 10, wherein said second means includes means for shifting the D.C. level of said second and fourth clock pulses.

* * * * *